(12) United States Patent
Arvin et al.

(10) Patent No.: US 11,152,282 B1
(45) Date of Patent: Oct. 19, 2021

(54) LOCALIZED CATALYST FOR ENHANCED THERMAL INTERFACE MATERIAL HEAT TRANSFER

(71) Applicant: International Business Machines Corporation, Armonk, NY (US)

(72) Inventors: Charles Leon Arvin, Poughkeepsie, NY (US); Kevin Drummond, Wappingers Falls, NY (US); Kenneth Charles Marston, Poughquag, NY (US); Chris Muzzy, Burlington, VT (US); Sushumna Iruvanti, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/906,015

(22) Filed: Jun. 19, 2020

(51) Int. Cl.
*H01L 23/36* (2006.01)
*H01L 23/433* (2006.01)
*H01L 21/48* (2006.01)

(52) U.S. Cl.
CPC ........ *H01L 23/433* (2013.01); *H01L 21/4814* (2013.01)

(58) Field of Classification Search
None
See application file for complete search history.

(56) References Cited

U.S. PATENT DOCUMENTS

| | | | |
|---|---|---|---|
| 7,489,033 B2 | 2/2009 | Hua et al. | |
| 7,678,615 B2 | 3/2010 | Touzelbaev et al. | |
| 7,833,839 B1 | 11/2010 | Touzelbaev et al. | |
| 8,865,527 B2 | 10/2014 | Too et al. | |
| 10,002,857 B2 | 6/2018 | Solimando et al. | |
| 2006/0261250 A1* | 11/2006 | Narita | H01L 24/32 250/208.1 |
| 2008/0063873 A1 | 3/2008 | Stapleton et al. | |
| 2008/0111234 A1* | 5/2008 | Hua | H01L 23/367 257/713 |
| 2016/0197025 A1 | 7/2016 | Bhagwagar et al. | |
| 2019/0348388 A1 | 11/2019 | Rajagopal et al. | |
| 2020/0066669 A1* | 2/2020 | Fry | H01L 43/02 |
| 2020/0303282 A1* | 9/2020 | Fry | H01L 23/3738 |
| 2020/0373220 A1* | 11/2020 | Chan Arguedas | H01L 23/3675 |
| 2021/0098334 A1* | 4/2021 | Sikka | H01L 21/76828 |

FOREIGN PATENT DOCUMENTS

EP 3270410 A1 7/2018

OTHER PUBLICATIONS

Subramanian et al., "Mechanical Characterization of Thermal Interface Materials and Its Challenges," Journal of Electronic Packaging, Mar. 2019.

* cited by examiner

*Primary Examiner* — Benjamin P Sandvik
(74) *Attorney, Agent, or Firm* — ZIP Group PLLC

(57) ABSTRACT

An IC device package includes an IC device that is connected to a lid by a thermal interface material (TIM). A catalyst material is formed upon one or more regions upon an upper surface of the IC device and/or an under surface of the lid. The catalyst material increases the rate of crosslinking of polymer chains of the TIM during TIM curing and/or increases the strength of crosslinks that link polymer chains of the TIM during TIM curing. The catalytically enhanced regions have a higher coefficient of heat transfer relative to non-catalytically enhanced regions. Therefore, the catalytically enhanced regions efficiently transfer heat from the IC device to the lid.

20 Claims, 11 Drawing Sheets

2

LOCALIZED CATALYST FOR ENHANCED THERMAL INTERFACE MATERIAL HEAT TRANSFER

FIELD

Embodiments of invention generally relate to integrated circuit (IC) device packages and IC device package fabrication methods. More particularly, embodiments relate to IC device packages that connect an IC package lid to an IC device with a thermal interface material (TIM).

BACKGROUND

IC devices, such as processors, and the like, have regions of high power utilization and other regions of relatively lower power utilization. There is a need to more efficiently remove heat, a byproduct of the high power utilization, from the high power utilization regions. Prior IC device packages have solved the need to remove heat from such regions with multiple material TIMs. However, it has been found that the multiple materials that make up the multiple material TIM tend to flow and/or bleed together subsequent to their application. As such, it is difficult to accurately locate the multiple materials so that a desired TIM of the multiple material TIM is properly located to correspond with the IC device high power utilization regions.

In some implementations, IC devices are mounted on organic laminate carriers. In such instances, the IC device may curve or warp as a result of assembling the IC device on to the carrier and underfilling between the IC device and the carrier, due to the differences in coefficient of thermal expansion (CTE) of the various components. The curvature may also undergo change as the device is powered on and off, again due to the CTE mismatch of the components. The change in curvature occurs when the temperature rises as the IC device is powered on, or when the temperature decreases when the device is power off. These curvature changes may strain the TIM placed between the IC device and a heat spreader or lid, especially along the edges of the IC device. A large TIM strain or a cyclic TIM strain with repeated power on/off cycles may result in weakly cross-linked TIM failing cohesively, or adhesively at the interface. The TIM break or failure may adversely affect the heat transfer through those areas.

SUMMARY

In an embodiment of the invention, an integrated circuit (IC) device package is presented. The IC device package includes an IC device mounted upon a substrate and a lid. The lid includes a under surface that is connected to an upper surface of the IC device by a polymeric thermal interface material (TIM). The TIM includes a first catalytically enhanced region and a second non-catalytically enhanced region. The first catalytically enhanced region includes a first extent of polymer chain cross-linking that has a first cross-link density enhanced by a catalyst localized upon a first portion of the upper surface of the IC device or upon a first portion of the under surface of the lid. The second non-catalytically enhanced region includes a second extent of polymer chain cross-linking that has a second cross-link density that is less than the first cross-link density.

In another embodiment of the invention, a method of fabricating an integrated circuit (IC) device is presented. The method includes connecting an IC device upon a substrate. The method further includes forming a catalyst material upon a first portion of an upper surface of the IC device or upon a first portion of an undersurface of a lid. The method further includes connecting the undersurface of the lid to the upper surface of the IC device with a polymeric thermal interface material (TIM). The method further includes curing the TIM to form a first catalytically enhanced region and a second non-catalytically enhanced region. The first catalytically enhanced region includes a first extent of polymer chain cross-linking that has a first cross-link density enhanced by the catalyst material. The second non-catalytically enhanced region includes a second extent of polymer chain cross-linking that has a second cross-link density smaller than the first cross-link density.

In another embodiment, a method is presented. The method includes connecting an integrated circuit (IC) device and a lid with a polymeric thermal interface material (TIM). The TIM includes a first catalytically enhanced region and a second non-catalytically enhanced region. The first catalytically enhanced region includes a first extent of polymer chain cross-linking that has a first cross-link density enhanced by the catalyst material. The second non-catalytically enhanced region includes a second extent of polymer chain cross-linking that has a second cross-link density smaller than the first cross-link density.

These and other embodiments, features, aspects, and advantages will become better understood with reference to the following description, appended claims, and accompanying drawings.

BRIEF DESCRIPTION OF THE DRAWINGS

So that the manner in which the above recited features of the present invention are attained and can be understood in detail, a more particular description of the invention, briefly summarized above, may be had by referencing the description of the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

The drawings are not necessarily to scale and are intended to depict exemplary embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. These exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

The accompanying figures and this description depicted and described embodiments of the present invention, and features and components thereof. Those skilled in the art will appreciate that any particular nomenclature used in this description was merely for convenience, and thus the invention should not be limited by the specific process identified and/or implied by such nomenclature. Therefore, it is desired that the embodiments described herein be considered in all respects as illustrative, not restrictive, and that reference be made to the appended claims for determining the scope of the invention.

Figure 1:
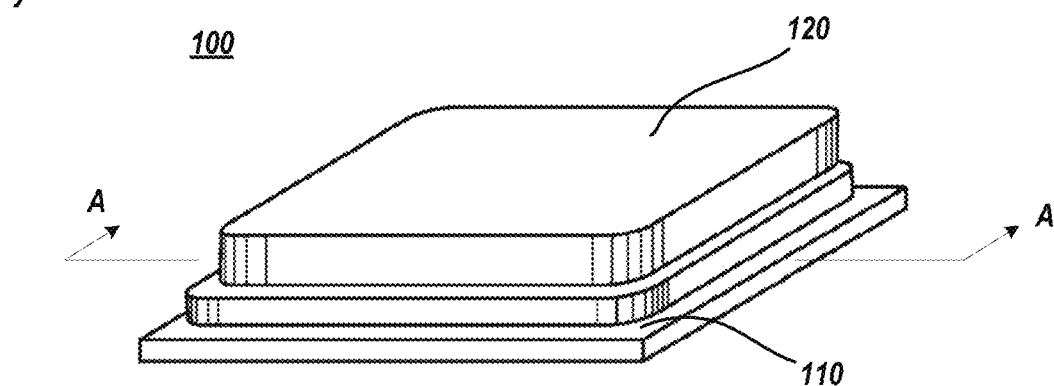
FIG. 1 depicts an isometric view of an IC device package that includes, utilizes, or implements one or more embodiments of the present invention.

FIG. 1 depicts an isometric view of an IC device package 100 that includes, utilizes, or implements one or more embodiments of the present invention. IC device package 100 includes a base substrate 110 and a lid 120 positioned thereon. Together, the substrate 110 and the lid 120 enclose an integrated circuit (IC) device 130 that is not visible in FIG. 1 but is shown in at least one subsequent figure. The lid 120 is depicted as a top hat design, although virtually other types or shapes of lid 120 may be utilized.

Figure 2:
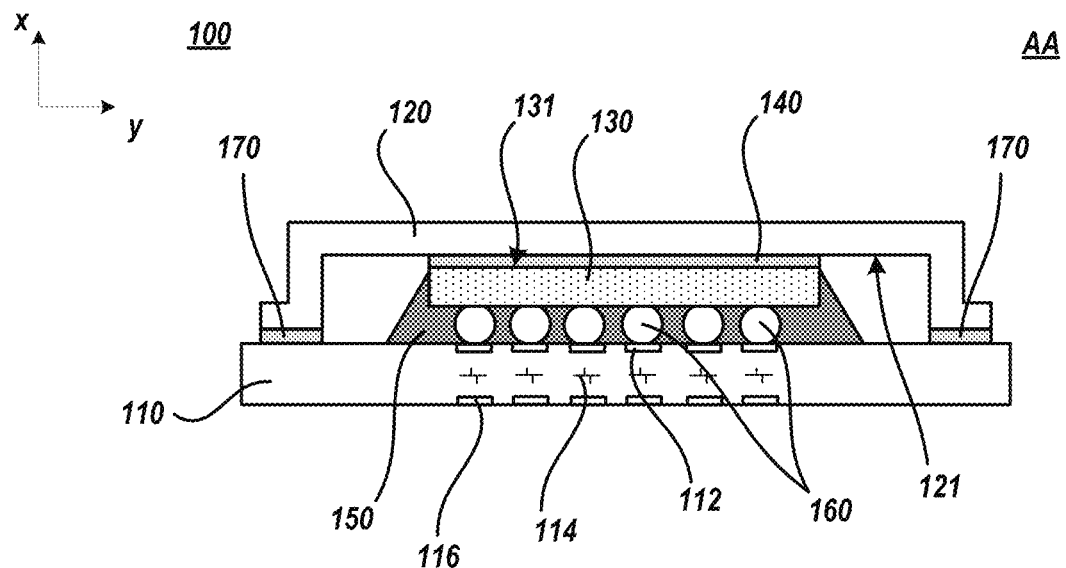
FIG. 2 depicts a cross section view of an IC device package that includes, utilizes, or implements one or more embodiments of the present invention.

FIG. 2 depicts a cross section view of IC device package 100, taken at section AA. An IC device 130, which may be a semiconductor device, processor, IC chip, die, or other type of device, as desired, is mounted or connected to the base substrate 110. The IC device 130 may be any of a myriad of different types of circuit devices used in electronics, such as, for example, microprocessors, graphics processors, application specific integrated circuits, field programmable gate arrays, memory devices or the like. The IC device 130 is shown flip-chip mounted to contact pads 112 of the substrate 110 and electrically interconnected therewith by way of a plurality of conductor structures 160. The conductor structures 160 may be solder bumps or balls, conductive pillars of copper or other conductive materials used with or without solder, or the like.

The substrate 110 may interconnect electrically with one or more external devices, such as circuit board, system board, or the like, in a variety of ways. In the exemplary embodiment, an array consisting of a plurality of contact pads 116 of the substrate 20 may connect with external devices via conductor structures such, as solder bumps or balls, conductive pillars of copper or other conductive materials used with or without solder, or the like. Optionally, a pin grid array, a land grid array, fuzz button array, or some other type of interconnect configuration may be used. The substrate 110 includes electrical pathways 114 therein to establish electrical connectivity between one or more of the contact pads 116 to one or more of the contact pad 112, respectively. The substrate 110 may be formed from polymeric materials, ceramic materials, or the like. The electrical pathways 114 of substrate 110 may actually consist of multiple layers of patterned metallization within and separated by dielectric material layers. The number of individual layers is largely a matter of design discretion. In certain exemplary embodiments, the number of layers may vary from four to sixteen. If such a build-up design is selected, a standard core, thin core or coreless arrangement may be used. The dielectric materials may be, for example, epoxy resin with or without fiberglass fill.

An underfill material 150 may be positioned between the IC device 130 and the substrate 110 to cushion and address issues of differing CTE's of the substrate 110 and the semiconductor device 110. The underfill material 150 may surround and electrically isolate the conductor structures 160. The underfill material 150 may be composed of well-known epoxy materials, such as epoxy resin with or without silica fillers and phenol resins, or the like.

The lid 120 may be composed of well-known plastics, ceramics, or metallic materials as desired. Some exemplary materials include nickel plated copper, anodized aluminum, aluminum-silicon-carbon, aluminum nitride, boron nitride or the like. In an exemplary embodiment, the lid 120 may consist of a core metal surrounded by outer metal. A heat spreader other than the depicted lid 120 may be used. For example, the substrate 110 may be a circuit board or card and the IC device 130 may be mounted thereon without a lid 120 but with a heat sink.

An adhesive seal band or bead 170 is positioned on the base substrate 110 in order to secure the lid 120 thereto. The adhesive 170 has a general outline that tracks the shape of the perimeter of the overlying lid 120. The adhesive 170 may be a continuous bead or a series of segments as desired. The adhesive 170 may be composed of well-known epoxies or other types of adhesives.

Lid 120 transfers heat away from the IC device 130. Thus, it is desirable to provide a low thermal resistance pathway between a lower surface 121 of the lid 120 and an upper surface 131 the IC device 130. The low thermal resistance pathway may consist of a thermal interface material (TIM) 140 between the lower surface 121 of the lid 120 and the upper surface 131 the IC device 130.

The thermal interface material 140 is advantageously composed of a base polymeric material or materials such as, for example, silicone rubber. Such polymeric materials may be termed "gel-type" TIMs in the art and may be applied on the lower surface 121 of the lid 120 and/or upon upper surface 131 the IC device 130 in an uncured state and subsequently cured. The term "cure" or the like is defined herein to be a process of or otherwise relating to polymer chemistry that produces toughening or hardening of a polymer material by cross-linking of polymer chains.

Figure 3:
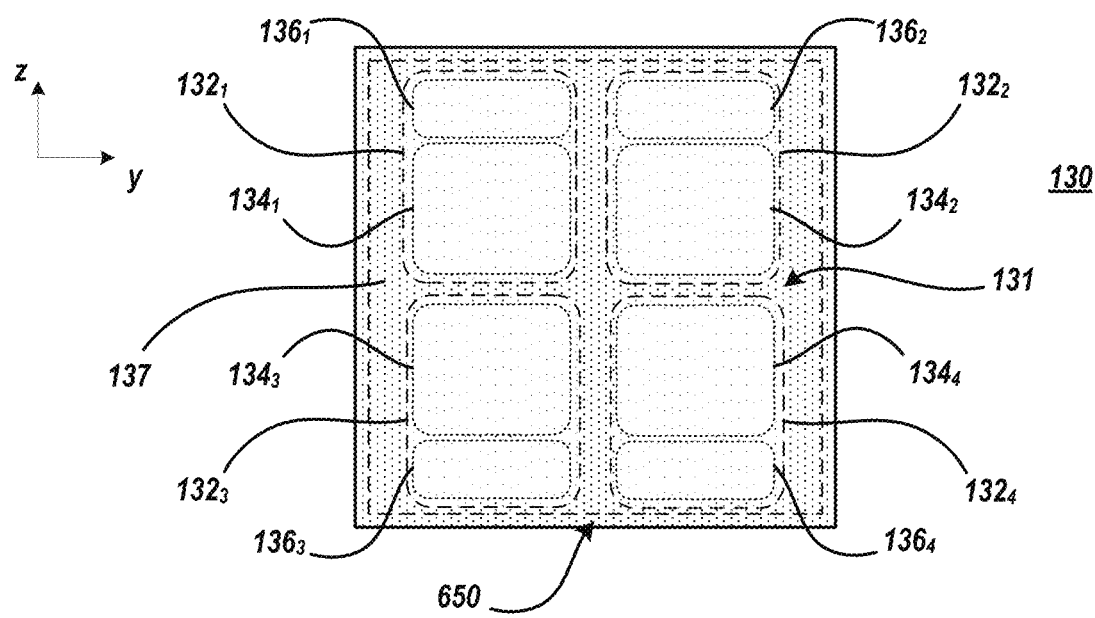
FIG. 3 depicts a normal view of an IC device upper surface that includes one or more IC device region projections, according to exemplary embodiments.

FIG. 3 depicts a normal view of IC device upper surface 131 that includes one or more IC device region projections 132, according to exemplary embodiments. IC device 130 may be a single core or multi-core IC device. Each IC device region projection 132 is a projection of a core, as is known in the art, of the IC device 130 onto the top surface 131 of IC device 130. An IC device region projection 132 may also be referred to herein as a core region projection 132. There is an equal number of IC device region projections 132 as there are cores in the IC device 130. As such, a single core IC device 130 has a single core region projection 132 on the top surface 131 of IC device 130. A multi core IC device 130 has multiple core region projections 132 on the top surface 131 of IC device 130. For example, and as is depicted, a quad core IC device 130 has four core region projections $132_1$, $132_2$, $132_3$, and $132_4$ on the top surface 131 of IC device 130.

The core of the IC device 130 typically has a higher power density relative to regions of the IC device 130 outside of the core. Therefore, the core typically generates more heat relative to the regions of the IC device 130 outside of the core. These core regions of the IC device 130 may, therefore, be termed a hot or power dense region. Similarly, the regions of the IC device 130 outside of core regions may be termed a cooler or power sparse region.

The core region projection 132 of such core may be the projection of the hot or power dense region onto the top surface 131 of IC device 130. Each region of the IC device 130 outside of a core region is typically a less power dense and relatively cooler region of the IC device 130. Therefore, the area(s) of top surface 131 of IC device 130 outside of the core region projection(s) 132 are projections of these cooler or power sparse regions of the IC device 130.

Within each core region projection 132 there may be a processing region projection 134 and a cache region projection 136. Each processing region projection 134 is a projection of the processing region of the associated core onto the top surface 131 of IC device 130. The processing region of the core may be the locations within the associated core of logic circuitry that responds to and processes instructions (i.e. the location of the core that which does the primary arithmetic functions, logic functions, I/O functions, command allocation functions, etc.). Each cache region projection 136 is a projection of the cache region of the associated core onto the top surface 131 of IC device 130. The cache region of the core may be the locations within the associated core that store data or instructions (i.e. level 1 cache, level 2 cache, etc.).

The processing region of the core typically has a higher power utilization density relative to the cache region of the core. Therefore, the processing region of the core typically generates more heat relative to the cache region of the core. Thus, processing region projection 134 is a projection of a relatively high power density and relatively high heat generation region of the associated core onto the top surface 131 of IC device 130. Likewise, cache region projection 136 is a projection of a relatively lower power density and relatively lower heat generation region of the associated core onto the top surface 131 of IC device 130. Consequently, a processing region may be termed a hot or power dense region and the associated processing region projection 134 may be the projection of such hot or power dense region onto the top surface 131 of IC device 130.

Figure 4:
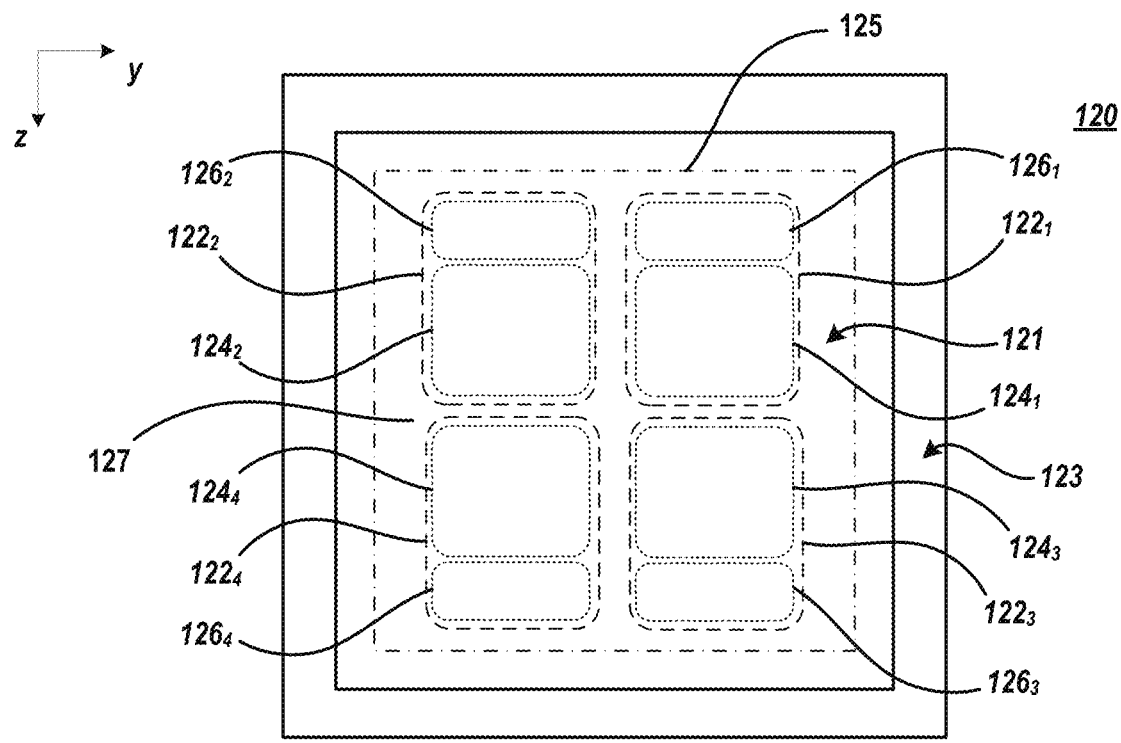
FIG. 4 depicts a normal view of an underside of an IC device package lid that includes one or more IC device region projections, according to exemplary embodiments.

FIG. 4 depicts a normal view of underside 121 of an IC device package lid 120 that includes one or more IC device region projections 122, according to exemplary embodiments.

Each IC device region projection 122 is a projection of a core of the IC device 130 onto the underside or surface 121 of lid 120, when lid 120 is or would be properly or otherwise anticipatedly located in relation to IC device 130. For example, and as is depicted, a lid 120 for a quad core IC device 130 has four core region projections $122_1$, $122_2$, $122_3$, and $122_4$ on the surface 121 of lid 120. The core region projection 122 of a core may be the projection of the hot or power dense region onto the surface 121 of lid 120. The area(s) of the surface 121 of lid 120 outside of the core region projection(s) 122 and within the footprint of IC device 130 are projections of the cooler or power sparse regions of the IC device 130.

Within each core region projection 122 there may be a processing region projection 124 and a cache region projection 126. Each processing region projection 126 is a projection of the processing region of the associated core onto surface 121 of lid 120, when lid 120 is or would be properly or otherwise anticipatedly located in relation to IC device 130. Each cache region projection 126 is a projection of the cache region of the associated core onto surface 121 of lid 120, when lid 120 is or would be properly or otherwise anticipatedly located in relation to IC device 130.

Processing region projection 124 is a projection of a relatively high power density and relatively high heat generation region of the associated core onto surface 121 of lid 120, when lid 120 is or would be properly or otherwise anticipatedly located in relation to IC device 130. Likewise, cache region projection 126 is a projection of a relatively lower power density and relatively lower heat generation region of the associated core onto surface 121 of lid 120, when lid 120 is or would be properly or otherwise anticipatedly located in relation to IC device 130.

Figure 5:
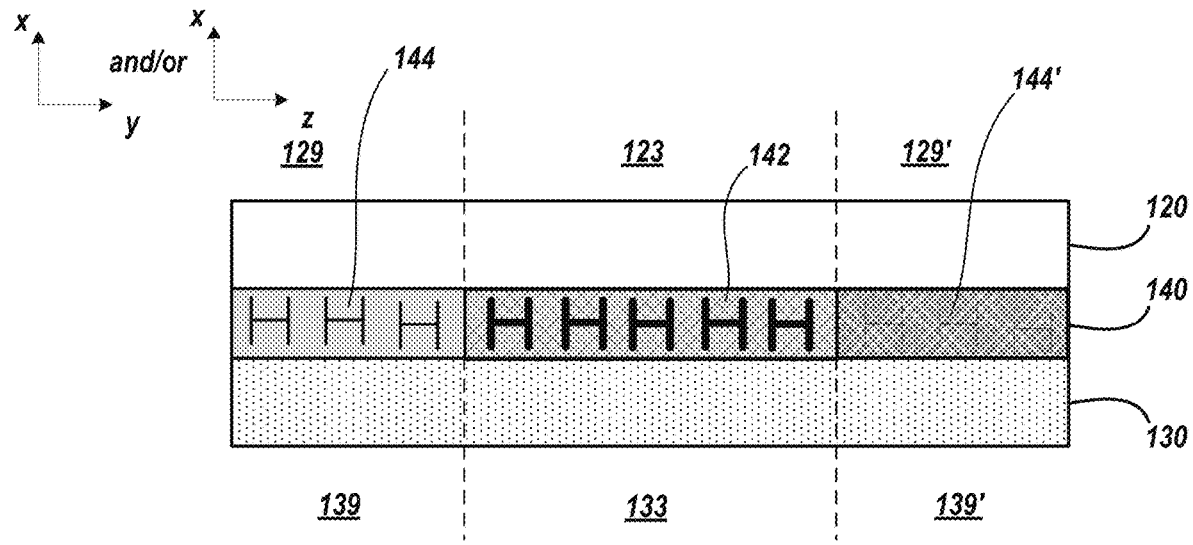
FIG. 5 depicts a thermal interface material that connects an IC device and an IC device package lid, according to exemplary embodiments.

FIG. 5 depicts TIM 140 that connects IC device 130 and lid 120, according to exemplary embodiments. TIM 140 is advantageously composed of a base polymeric material that have been cured so as to toughen or harden the base polymer material of the TIM by cross-linking of polymer chains. TIM 140 includes one base polymeric material that which is at least catalytically enhanced in one or more particular regions 142 during curing (i.e. crosslinking is catalytically enhanced). In some embodiments, TIM 140 may further include one or more regions 144' where the base polymeric material is poisoned during curing (i.e. crosslinking is poisoned, prevented, limited, etc.). TIM 140 may further include one or more nominal regions 144 where the base polymeric material is neither catalytically enhanced nor poisoned during curing.

In light of above, TIM 140 includes enhanced crosslinked region(s) 142 that includes catalytically enhanced crosslinked polymer chains. In embodiments, TIM 140 may also include nominal or non-enhanced non-poisoned crosslinked region(s) 144 that includes non-catalytically enhanced and/or non-poisoned crosslinked polymer chains. TIM 140 may also include poisoned crosslinked region(s) 144' that includes poisoned crosslinked polymer chains.

Each region 142 is configured or otherwise positioned to connect a hot or power dense region 133 of IC device 130 to an associated hot region 123 of lid 120. Hot or power dense region 133 consists of either a core region projection 132 or a processing region projection 134 on the surface 131 of IC device 130. Hot region 123 consists of either a core region projection 122 or a processing region projection 124 on the surface 121 of lid 120. Hot or power dense region 133 is the same type of region relative to hot region 123. In other words, region 133 consists of a core region projection 132 on the surface 131 of IC device 130 and hot region 123 consists of a core region projection 122 on surface 121 of lid. Alternatively, hot or power dense region 133 consists of a processing region projection 134 on surface 131 of the IC device 130 and hot region 123 consists of a processing region projection 124 on surface 121 of lid 120.

When region 144 is included in TIM 140, region 144 may be configured or otherwise positioned to connect a nominally hot or nominally power dense region 139 of IC device 130 to an associated nominally hot or nominally power dense region 129 of lid 120. Region 139 is a region of IC device 130 that operates at a lower temperature or consumes less power than hot or power dense region 133 of IC device 130. For example, when region 133 is a core region 122 then region 139 may be outside of core region 122 or when region 133 is a processing region 124 then region 139 may be cache region 126. Nominally hot or nominally power dense region 129 is a projection of the region 139 of IC device 130 onto surface 121 of cover 120.

When region 144' is included in TIM 140, region 144' may be configured or otherwise positioned to connect a cooler or power sparse region 139' of IC device 130 to an associated cooler or power sparse region 129' of lid 120. Region 139' is a region of IC device 130 that operates at a lower temperature or consumes less power than hot or power dense region 133 of IC device 130. For example, when region 133 is a core region 122 then region 139' may be outside of core region 122 or when region 133 is a processing region 124 then region 139' may be cache region 126. Cooler or power sparse region 129' is a projection of the region 139' of IC device 130 onto surface 121 of cover 120.

The cured polymer material within regions 142 may be referred to herein as strongly linked or crosslinked, the material within regions 144' may be referred to herein as super weakly linked or crosslinked, and the material within regions 144 may be referred to herein as weakly linked or crosslinked, through it is to be understood that the material in regions may 144 be, in fact, similarly crosslinked but to a lesser degree than those chains in regions 142, the material in regions may 144' be, in fact, similarly crosslinked but to a lesser degree than those chains in regions 144, etc. The strongly linked material within region 142 is also generally more strongly adhered to regions 123/133, the weakly linked material within region 144 is nominally adhered to regions 129/139, and the super weakly linked material within region 144' is weakly adhered to regions 129'/139'.

The term catalyst or the like is defined herein to be or relating to a substance that increases the rate of crosslinking of polymer chains during curing and/or increases the strength of crosslinks that link polymer chains during curing without itself undergoing any permanent chemical change.

The term poison or the like is defined herein to be or relating to a substance that decreases the rate of crosslinking of polymer chains during curing and/or decreases the strength of crosslinks that link polymer chains during curing without itself undergoing any permanent chemical change.

During curing of the TIM 140, the catalyst may increase the strength of crosslinking of polymer chains such that the crosslinks pull the linked chains closer together, pull filler particles closer together, and/or pull a filer particle closer to a chain. As such, neighboring filler particles and/or chains of the TIM 140 polymer region 142 may be closer relative to neighboring filler particles and/or chains of the TIM 140 polymer in region 144. Due to the relative closeness of these chains and/or the filler particles in region 142, there is greater or more efficient heat transfer there between relative to region 144. During curing of the TIM 140, the poison may decrease the strength of crosslinking of polymer chains and/or filler particles such that the crosslinks are allowed to be spaced further apart. As such, neighboring chains and/or filler particles of the TIM 140 polymer region 144' may be further apart relative to neighboring chains and/or filler particles of the TIM 140 polymer in region 144. Due to the relative distance of chains and/or filler particles in region 144', there is less or less efficient heat transfer there between relative to region 144.

In addition to, or alternatively, during curing of the TIM 140, the catalyst may increase the rate of crosslink formation between neighboring chains and/or filler particles. As such, neighboring chains and/or filler particles of the TIM 140 region 142 may be linked by relatively a greater density of crosslinks relative to a density of crosslinks that link neighboring chains and/or filler particles of the TIM 140 polymer in region 144. In other words, more crosslinks are formed in region 142 than in region 144 due to the more rapid crosslink formation in region 142. Due to the increased number of links between linked chains and/or filler particles in region 142, there is greater or more efficient heat transfer between linked chains relative to the linked chains in region 144. In some embodiments, there may be a relatively greater density of filler particles in region 142 to further increase heat transfer efficiency therein. Likewise, during curing of the TIM 140, the poison may decrease the rate of crosslink formation between neighboring chains and/or filler particles. As such, neighboring chains and/or filler particles of the TIM 140 region 144' may be linked by relatively or a less density of crosslinks relative to a density of crosslinks that link neighboring chains and/or filler particles of the TIM 140 polymer in region 144. In other words, fewer crosslinks are formed in region 144' than in region 144 due to the decrease of crosslink formations in region 144'. Due to the smaller number of links between linked chains and/or linked filler particles in region 144', there is less or less efficient heat transfer between linked chains relative to the linked chains in region 144. In some embodiments, there may be a relatively smaller density of filler particles in region 144.

Because the polymer chains in region 142 are enhanced relative to the chains in region 144, polymer chains in region 142 may be relatively tougher and/or harder and deform less than the crosslinked chains in region 144. For example, the strongly crosslinked material in region 142 may have a 5% to 20% greater relative toughness, hardness, etc. value relative to the weakly crosslinked material in region 144. In a particular embodiment, the strongly crosslinked material in region 142 has a 5% to 20% greater relative modulus value relative to the weakly crosslinked material in region 144.

Similarly, because the polymer chains in region 144' are poisoned relative to the chains in region 144, polymer chains in region 144' may be relatively weaker and/or softer and deform more than the crosslinked chains in region 144. For example, the super weakly crosslinked material in region 144' may have a 5% to 20% lower relative toughness, hardness, etc. value relative to the weakly crosslinked material in region 144. In a particular embodiment, the super weakly crosslinked material in region 144' has a 5% to 20% smaller relative modulus value relative to the weakly crosslinked material in region 144.

TIM 140 is a TIM that includes a base polymer that is susceptible to being catalytically enhanced and/or poisoned during curing as is consistent with the description of one or more of the embodiments herein. For example, TIM 140 may be Dow Corning TC-3040 Thermally Conductive Gel, Shin-Etsu MicroSi X-23-7772-4 Thermally Conductive Gel, or the like.

Figure 6A:
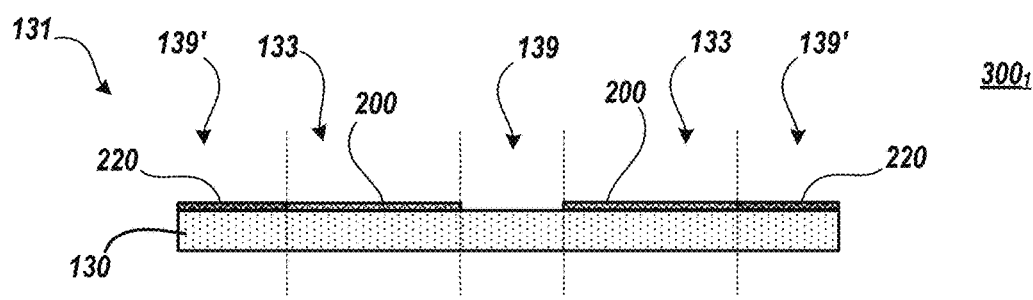
FIG. 6A and FIG. 6B depict IC device package fabrication stages, according to exemplary embodiments.
Figure 6B:
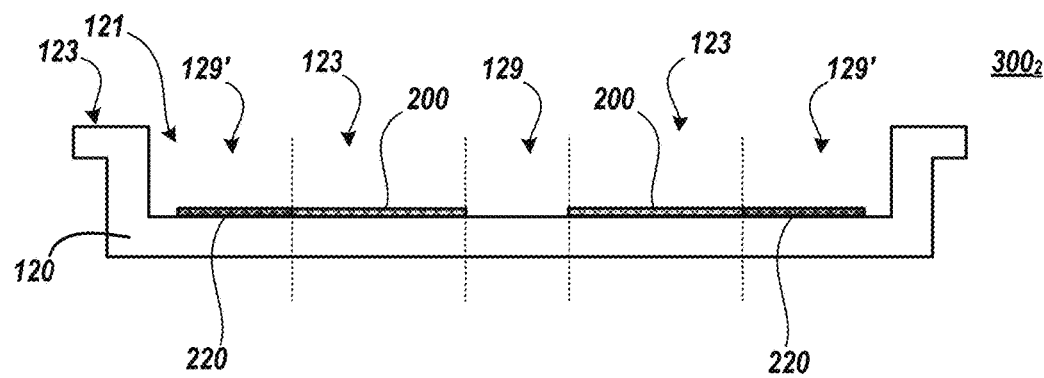

FIG. 6A depicts IC device package 100 fabrication stage 300₁ and FIG. 6B depicts IC device package fabrication stage 300₂. At fabrication stage 300, a catalyst 200 is formed upon surface 131 of IC device 300 (stage 300₁) and/or catalyst 200 is formed upon surface 121 of lid 120 (stage 300₂). Further at fabrication stage 300, a poison 220 may be formed upon surface 131 of IC device 300 (stage 300₁) and/or poison 220 is formed upon surface 121 of lid 120 (stage 300₂).

At this stage 300, the IC device 130 may be previously connected to the substrate 110 and the underfill 150 is in place. Further, at stage 300, seal band 170 may be previously applied to substrate 110. In this illustrative embodiment, catalyst 200 is selectively formed within regions 133 upon surface 131 of IC device 300 and/or catalyst 200 is selectively formed within regions 123 upon surface 121 of lid 120. The term selectively formed is defined herein to be formed solely within. As such, catalyst 200 may be formed solely within regions 123 upon surface 121 of lid 120 and/or solely within regions 133 upon surface 131 of IC device 300.

Catalyst 200 is a substance that increases the rate of crosslinking of polymer chains during curing and/or increases the strength of crosslinks that link polymer chains during curing without itself undergoing any permanent chemical change. Exemplary catalyst 200 materials may be Aluminum (Al), Platinum (Pt), Ruthenium (Ru), Rhodium (Rh), Iridium (Jr), Palladium (Pd), Titanium (Ti), Neodymium (Nd), Thorium (Th), etc. based or derivative materials, metal alloys thereof, and/or metal oxides thereof, or the like.

Catalyst 200 may be formed by known selection deposition techniques, such as electroplating deposition, laser write deposition, or the like. Further catalyst 200 formation techniques electroplating of catalyst 200 in metal form, laser writing of catalyst 200 in paste or power form, electroless plating of catalyst 200 that is preceded by an earlier seed formation or adhesion stage, deposition of catalyst 200 upon that is preceded by the formation of an earlier anodized Nickel (Ni) layer, or the like. Catalyst 200 may be formed as a layer upon the underlying surface within regions 123 to a thickness between 2 angstroms to 1 nm in thickness. In some embodiments, the underlying surface within regions 123 may be entirely coated or covered by catalyst 200, may have a 50 to 500 ppm surface coverage by catalyst 200, or the like.

In in a preferred embodiment, a Platinum (Pt) catalyst 200 is selectively formed within regions 123 upon surface 121 of lid 120 and/or solely within regions 133 upon surface 131 of IC device 300 utilizing known laser write deposition techniques. In this implementation, the Platinum catalyst 200 may be formed to a thickness ranging from 0.1 nm to 1 nm, with a preferred thickness of 0.5 nm.

Further, in this illustrative embodiment, poison 220 may be selectively formed within regions 139' upon surface 131 of IC device 300 and/or poison 220 is selectively formed within regions 129' upon surface 121 of lid 120. As such, poison 220 may be formed solely within regions 129' upon surface 121 of lid 120 and/or solely within regions 139' upon surface 131 of IC device 300.

Poison 220 substance that decreases the rate of crosslinking of polymer chains during curing and/or decreases the strength of crosslinks that link polymer chains during curing without itself undergoing any permanent chemical change. Exemplary poison 220 materials may be Copper (Cu), Sulfur (S), high sulfur (S) containing electrolytic plated Nickel (Ni) and Cobalt (Co), high Chloride containing electrolytic Nickel (Ni) and Cobalt (Co), high phosphorous (P) containing electroless Ni, or the like.

Poison 220 may be formed by known selection deposition techniques, such as electroplating deposition, laser write deposition, or the like. Further poison 220 formation techniques may be electroplating of catalyst 200 in metal form, laser writing of poison 220 in paste or powder form, electroless plating of poison 220 that is preceded by an earlier seed formation or adhesion stage, removal of a Nickel layer of the Nickel plated Copper lid 120 to expose the Copper poison 220. Poison 220 may be formed as a layer upon the underlying surface within regions 139', 129' to a thickness between 2 angstroms to 1 nm in thickness. In some embodiments, the underlying surface within regions 139', 129' may be entirely coated or covered by poison 220, may have a 50 to 500 ppm surface coverage by poison 220, or the like.

In in a preferred embodiment, a Sulphur powder poison 220 is selectively formed within regions 129' upon surface 121 of lid 120 and/or solely within regions 139' upon surface 131 of IC device 300 utilizing known laser write deposition techniques. In this implementation, the Sulphur powder poison 220 may be formed to a thickness ranging from 0.1 nm to 1 nm, with a preferred thickness of 0.5 nm.

Further, in this illustrative embodiment, within region 139 of IC device 130, the surface 131 of IC device 131 may be left exposed (i.e. neither catalyst 200 or poison 220 is formed thereon) and within region 129 of lid 120, the surface 121 of lid 120 may be left exposed (i.e. neither catalyst 200 or poison 220 is formed thereon).

Figure 7A:
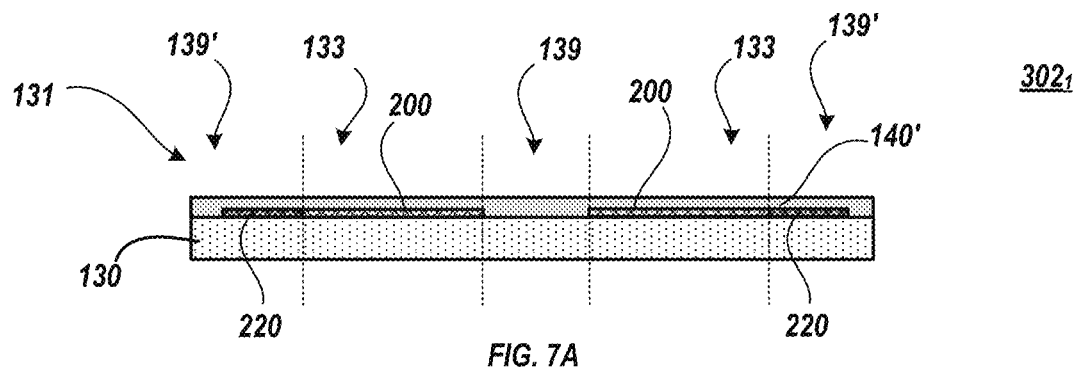
FIG. 7A and FIG. 7B depict IC device package fabrication stages, according to exemplary embodiments.
Figure 7B:
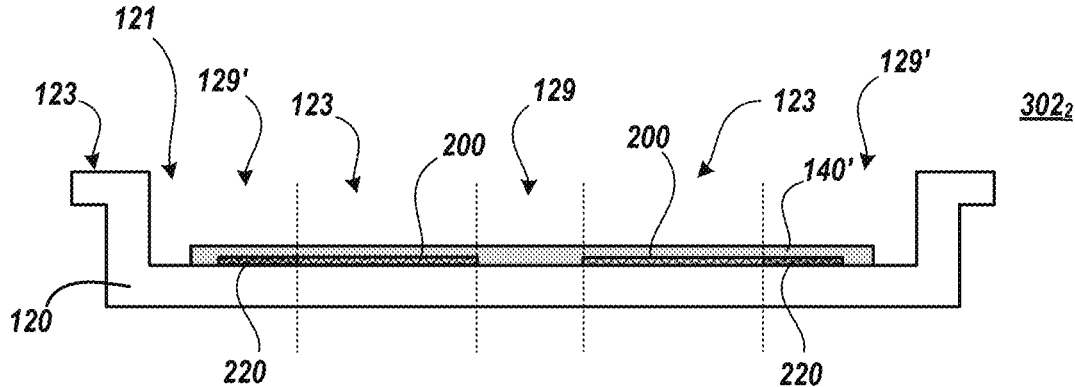

FIG. 7A depicts IC device package 100 fabrication stage 302₁ and FIG. 7B depicts IC device package fabrication stage 302₂. At fabrication stage 302, uncured TIM 140' is formed upon surface 131 of IC device 300 (stage 302₁) and/or uncured TIM 140' is formed upon surface 121 of lid 120 (stage 302₂).

Uncured TIM 140' may be dispensed upon surface 131 of IC device 300 and/or upon surface 121 of lid 120 by dispensing the uncured TIM 140' in a predetermined pattern, such as a star pattern, x pattern, or the like. A dispenser such as a nozzle, a wiper, or some other type of dispenser may be utilized. Uncured TIM 140' may further be formed upon at least a portion of catalyst 200. For example, the pattern of dispensed uncured TIM 140' may traverse or intersect locations of catalyst 200 and/or poison 220 and may therefore also be formed upon at least a portion of catalyst 200 and/or poison 220.

Figure 8:
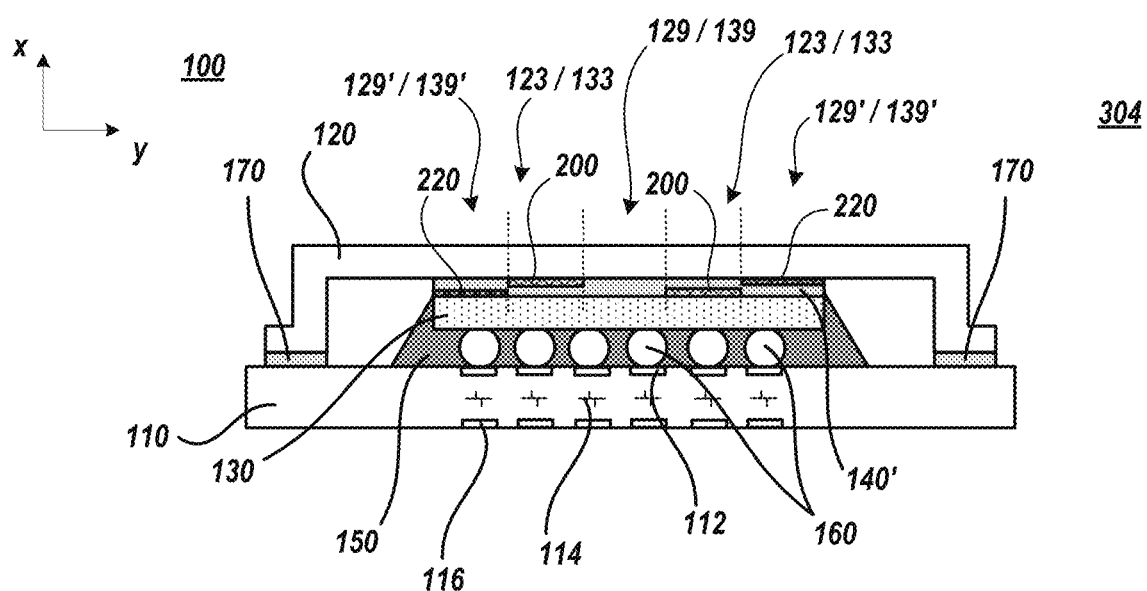
FIG. 8 depicts an IC device package fabrication stage, according to exemplary embodiments.

FIG. 8 depicts IC device package 100 fabrication stage 304, according to exemplary embodiments. At fabrication stage 304, lid 120 is attached or otherwise connected to IC device 130 and/or substrate 110. For example, the seal band 170 may be applied around the perimeter of the IC device 130 to correspond with substrate facing surface 123 of lid 120, shown for example in FIG. 4. The lid 120 may be seated on the seal band 170. In this manner, the lid 120 may be connected to substrate 110 by the seal band 170. Simultaneously, the lid underside surface 121 compresses the pattern of uncured TIM 140'. The uncured TIM 140' is compressed or flattened so that uncured TIM 140' is formed upon the entire or substantially (plus or minus the standard fabrication or manufacturing tolerance) the entire surface 131 of IC device 130. In this manner, the lid 120 may be connected to IC device 130 by the uncured TIM 140'.

Figure 9:
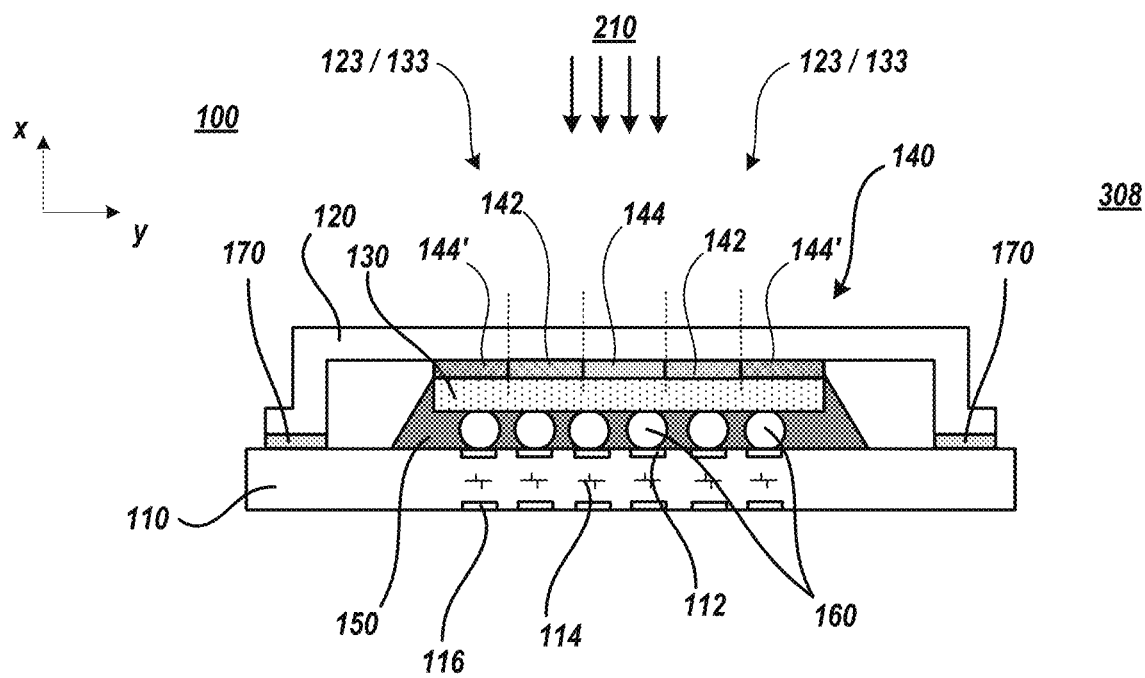
FIG. 9 depicts an IC device package fabrication stage, according to exemplary embodiments.

FIG. 9 depicts an IC device package 100 fabrication stage 306, according to exemplary embodiments. At stage 306, the IC device 130 package is subjected to a curing stage 210 to cure at least uncured TIM 140' thereby forming cured TIM 140. In some implementations, the curing stage 210 may also cure the seal band 170.

The curing stage 210 may be a single stage cure or multiple stage cure, as is known in the art. For example, curing stage 210 may be a two stage cure that consists of a medium high temperature step at about 90 to 110° for about 45 to 70 minutes followed by a high temperature cure at about 140 to 160° C. for about 90 to 140 minutes. The medium high temperature step is designed to drive out any lingering solvents without boiling. The high temperature step is designed to provide a final cure for the uncured TIM 140'.

In curing stage 210, one or more catalytically enhanced regions 142 is formed within TIM 140. In some embodiments, in curing stage 210, one or more nominal regions 144 are formed within TIM 140 and/or one or more poisoned regions 144' are formed within TIM 140.

In region 142, the catalyst 200 catalytically enhances the base polymer of TIM 140 as described herein. In region 144, the absence of catalyst 200 and the absence of poison 220 allows for nominal curing or crosslinking. In region 144', the poison 220 poisons the base polymer of TIM 140 as described herein.

Figure 10A:
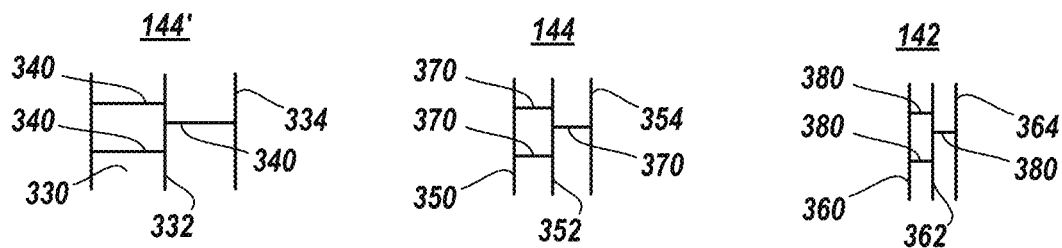
FIG. 10A depicts crosslinked polymer chains of a thermal interface material that connects an IC device and an IC device package lid, according to exemplary embodiments.

FIG. 10A depicts crosslinked polymer chains within TIM 140 that connects IC device 130 and IC device package lid 120, according to exemplary embodiments.

In region 144, there includes multiple polymer chains 350, 352, 354, etc. Neighboring polymer chains 350, 352, 354, etc. are linked by crosslinks 370. In catalytically enhanced region 142, there includes multiple polymer chains 360, 362, 364, etc. Neighboring polymer chains 360, 362, 364, etc. are linked by crosslinks 380. In poisoned region 144', there includes multiple polymer chains 330, 332, 334, etc. Neighboring polymer chains 330, 332, 334, etc. are linked by crosslinks 340.

The average distance between neighboring polymer chains in region 144 (i.e. the length of the cross links 370) may be relatively greater compared to the average distance between neighboring polymer chains in the catalytically enhanced region 142 (i.e. the length of the cross links 380). Likewise, the average distance between neighboring polymer chains in region 144' (i.e. the length of the cross links 340) may be relatively greater compared to the average distance between neighboring polymer chains in the nominal region 144 (i.e. the length of the cross links 370).

Catalytically enhanced region 142 of TIM 140 may have a higher coefficient of heat transfer relative to region 144 of TIM 140 due to the average relative closeness of crosslinked chains 360, 362, 364, the relative closeness of filler particles, and/or the relative closeness of a linked chain and filler particle. Because the crosslinked chains 360, 362, 364, etc. or other particles may be closer to each other in region 142, there is increased neighboring chain to chain, filler particle to filler particle, and/or chain to filler particle heat transfer. In other words, the heat transfer coefficient may be relatively increased in region 142 due to there being less average distance between the crosslinked chains 360, 362, 364, between the filler particles, and/or between the chain and filler particle, relative to such features in region 144.

Similarly, poisoned region 144' of TIM 140 may have a lower coefficient of heat transfer relative to region 144 of TIM 140 due to the average relative space or distance between crosslinked chains 330, 332, 334, between filler particles, and/or between chain and filler particle. Because the crosslinked chains 330, 332, 334, filler particles, and/or chain to filler particle, are further apart from each other in region 144', there is decreased neighboring feature to feature heat transfer. In other words, the heat transfer coefficient may be relatively decreased in region 144' due to there being a greater average distance between the crosslinked chains 330, 332, 334, filler particles, and chain to filler particle, relative to such features in region 144.

Figure 10B:
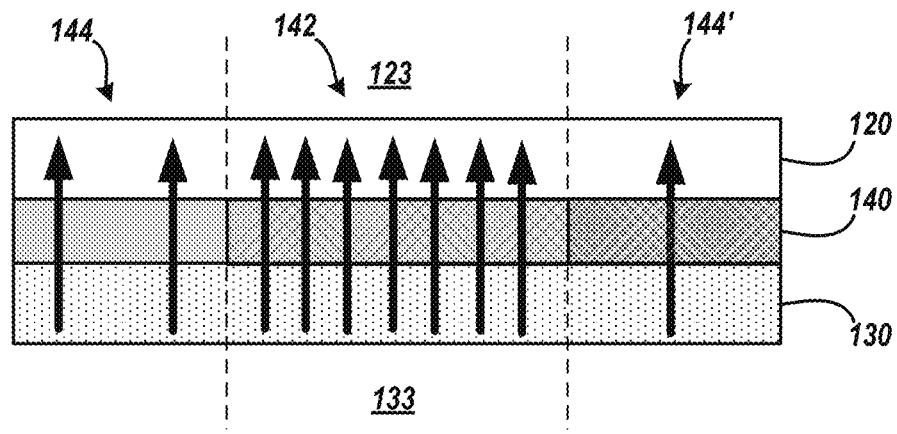
FIG. 10B depicts a thermal interface material that connects an IC device and an IC device package lid, according to exemplary embodiments.
Figure 10C:
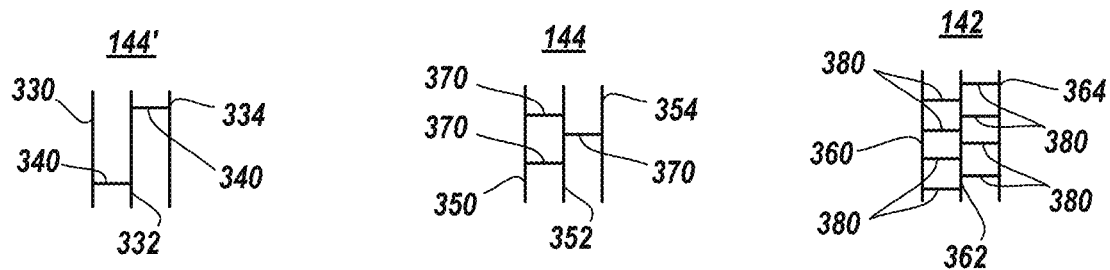
FIG. 10C depicts crosslinked polymer chains of a thermal interface material that connects an IC device and an IC device package lid, according to exemplary embodiments.

FIG. 10C depicts crosslinked polymer chains within TIM 140 that connects IC device 130 and IC device package lid 120, according to exemplary embodiments.

In region 144, there includes multiple polymer chains 350, 352, 354, etc. Neighboring polymer chains 350, 352, 354, etc. are linked by crosslinks 370. In catalytically enhanced region 142, there includes multiple polymer chains 360, 362, 364, etc. Neighboring polymer chains 360, 362, 364, etc. are linked by crosslinks 380. In poisoned region 144', there includes multiple polymer chains 330, 332, 334, etc. Neighboring polymer chains 330, 332, 334, etc. are linked by crosslinks 340. The average distance between neighboring polymer chains in region 144 (i.e. the length of the cross links 370) may be the same or similar to the average distance between neighboring polymer chains in the catalytically enhanced region 142 (i.e. the length of the cross links 380). Likewise, the average distance between neighboring polymer chains in region 144' (i.e. the length of the cross links 340) may be the same or similar to the average distance between neighboring polymer chains in the nominal region 144 (i.e. the length of the cross links 370).

Catalytically enhanced region 142 of TIM 140 may have a higher coefficient of heat transfer relative to region 144 of TIM 140 due to an average relative greater number or density of cross links 380 relative to the average number or density of cross links 370. Because the crosslinked chains 360, 362, 364, filler particle to filler particle, and/or chain to filler particle. have relatively more cross links 380, there is increased neighboring feature to feature heat transfer. In other words, the heat transfer coefficient is relatively increased in region 142 due to there being more crosslinks 380 that link neighboring chains 360, 362, 364, filler particle to filler particle, and/or chain to filler particle relative to number of cross links 370 that link such features in region 144.

Poisoned region 144 of TIM 140 may have a lower coefficient of heat transfer relative to region 144 of TIM 140 due to an average relative fewer number or lower density of cross links 340 relative to the average number or density of cross links 370. Because the crosslinked chains 330, 332, 334, filler particle to filler particle, and/or chain to filler particle have relatively fewer cross links 340, there is decreased neighboring feature to feature heat transfer. In other words, the heat transfer coefficient is relatively decreased in region 144' due to there being fewer crosslinks 340 that link neighboring chains 330, 332, 334, filler particle to filler particle, and/or chain to filler particle relative to number of cross links 370 that link such features in region 144.

FIG. 10B depicts TIM 140 that connects an IC device and an IC device package lid, according to exemplary embodiments. Because region 142 has a relatively higher heat transfer coefficient relative to region 144, region 142 more efficiently transfers heat away from IC device 130 into lid 120. This efficient heat transfer is depicted by more arrows from IC device 130 into lid 120 in region 142, as compared to the number of arrows from IC device 130 into lid 120 in region 144. Further, because region 144 has a relatively higher heat transfer coefficient relative to region 144', region 144 more efficiently transfers heat away from IC device 130 into lid 120. This efficient heat transfer is depicted by more arrows from IC device 130 into lid 120 in region 144, as compared to the number of arrows from IC device 130 into lid 120 in region 144'.

Figure 11:
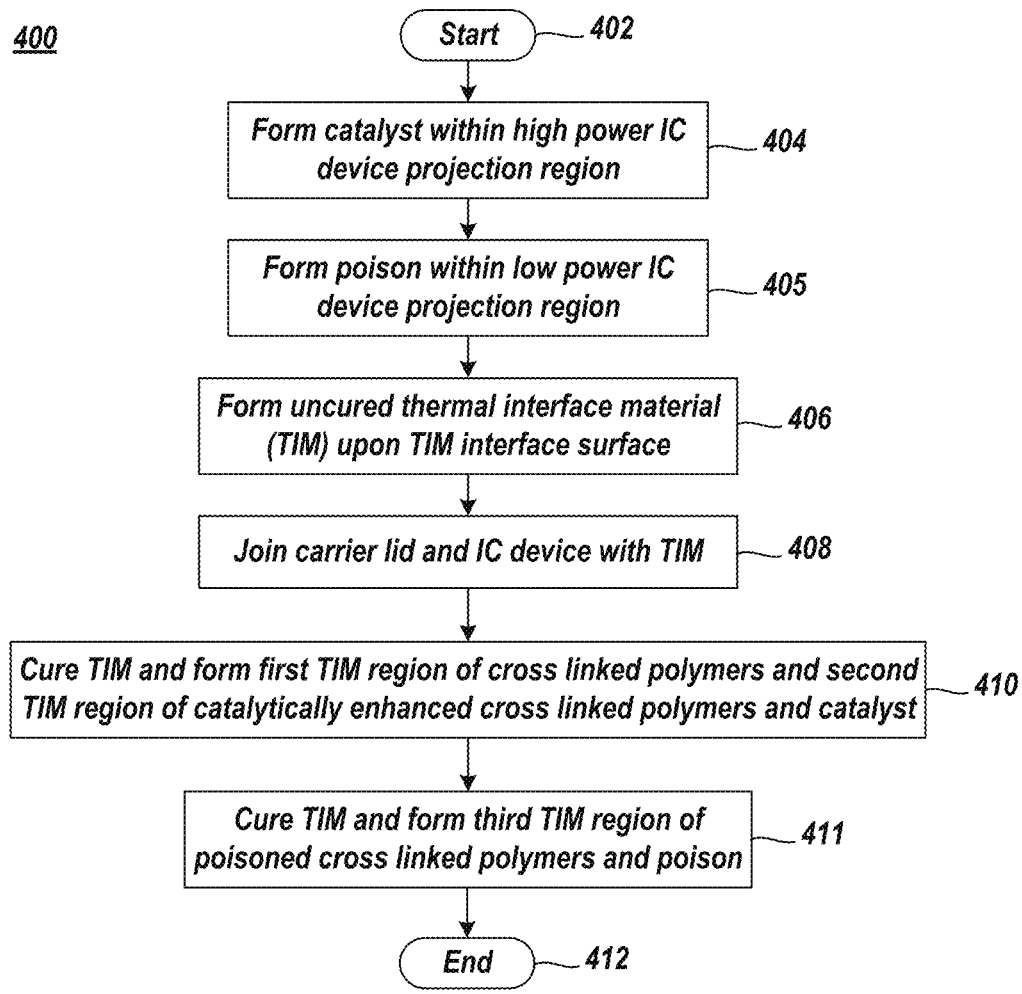
FIG. 11 depicts an IC device package fabrication method, according to exemplary embodiments.

FIG. 11 depicts an IC device package fabrication method 400, according to exemplary embodiments. Method 400 begins at block 402 and continues with forming catalyst 200 within a high power IC device projection region (block 404). For example, catalyst 200 may be selectively formed within regions 133 upon surface 131 of IC device 300 and/or catalyst 200 may be selectively formed within regions 123 upon surface 121 of lid 120.

Method 400 may continue with forming poison 220 within a low power IC device projection region (block 405). For example, poison 220 may be selectively formed within regions 139' upon surface 131 of IC device 300 and/or poison 220 may be selectively formed within regions 129' upon surface 121 of lid 120.

Method 400 may continue with forming uncured TIM 140' upon one or more TIM interface surfaces (block 406). For example, uncured TIM 140' may be formed upon surface 131 of IC device 300 and/or uncured TIM 140' may be formed upon surface 121 of lid 120. Uncured TIM 140' may be dispensed upon surface 131 of IC device 300 and/or upon surface 121 of lid 120 by dispensing the uncured TIM 140' in a predetermined pattern, such as a star pattern, x pattern, or the like. Uncured TIM 140' may further be formed upon at least a portion of catalyst 200. For example, the pattern of dispensed uncured TIM 140' may traverse or intersect locations of catalyst 200 and may therefore also formed upon at least a portion of catalyst 200.

Method 400 may continue with joining lid 120 and IC device 130 with the uncured TIM 140' (block 408). In some instances, the lid 120 may also be connected to the substrate 110. For example, seal band 170 may be applied around the perimeter of the IC device 130 to correspond with substrate facing surface 123 of lid 120. The lid 120 may be joined to the seal band 170. In this manner, the lid 120 may be connected to substrate 110 by the seal band 170. Simultaneously, the lid underside surface 121 may be joined to the IC device 130. When thereto joined, the relative forces between the lid 120 and IC device 130 compresses the pattern of uncured TIM 140' so that uncured TIM 140' is formed upon the entire or substantially the entire surface 131 of IC device 130.

Method 400 may continue with curing the TIM 140' to form cured TIM 140 that includes a first catalytically enhanced cured region 142 and a second non catalytically enhanced cured region 144 (block 410). The first catalytically enhanced cured region 142 has a higher coefficient of heat transfer relative to the second non catalytically enhanced cured region 144 due to the relative closeness of the polymer chains 360, 362, 364, etc. within region 142 and/or the higher density of crosslinks 380 that link the polymer chains 360, 362, 364, etc. within region 142.

Method 400 may continue with curing the TIM 140' to form cured TIM 140 that includes a third crosslinked poisoned cured region 144' (block 411). The crosslinked poisoned region 144' has a lower coefficient of heat transfer relative to the second non catalytically enhanced cured region 144 due to the relative distance of the polymer chains 330, 332, 334, etc. within region 144' and/or the lower density of crosslinks 330 that link the polymer chains 330, 332, 334, etc. within region 144'. Method 400 may end at block 412.

Figure 12A:
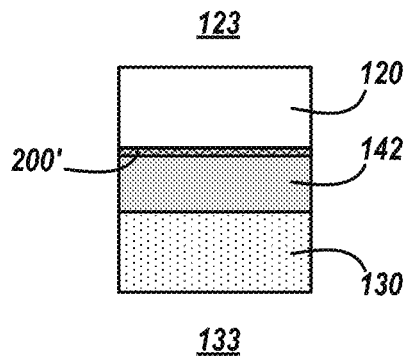
FIG. 12A and FIG. 12B depicts residual catalyst material within a catalytically enhanced region of a thermal interface material that connects an IC device and an IC device package lid, according to exemplary embodiments.
Figure 12B:
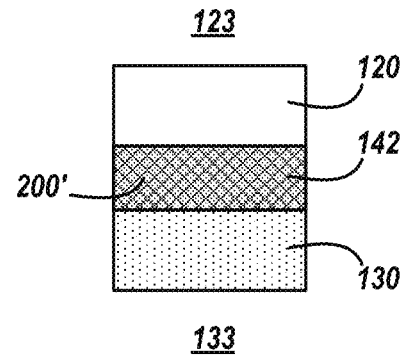

FIG. 12A and FIG. 12B depicts residual catalyst 200' within catalytically enhanced region 142 of TIM 140 that connects IC device 130 and lid 120, according to exemplary embodiments. As depicted in FIG. 12A, depending upon the type of catalyst 200, residual catalyst 200' may reside upon the applied surface 121 of lid 120 and/or surface 131 of IC device 130, subsequent to the curing of TIM 140' that forms TIM 140. As depicted in FIG. 12B, depending upon the type of catalyst 200, residual catalyst 200' may be dispersed within region 142, subsequent to the curing of TIM 140' that forms TIM 140.

Figure 12C:
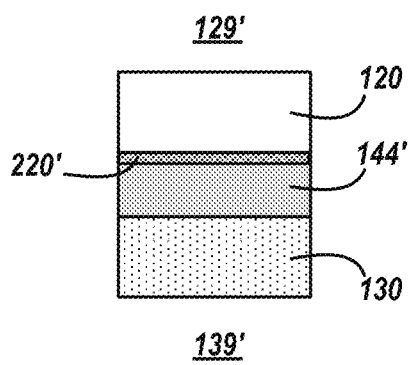
FIG. 12C and FIG. 12D depicts residual poison material within a poisoned region of a thermal interface material that connects an IC device and an IC device package lid, according to exemplary embodiments.
Figure 12D:
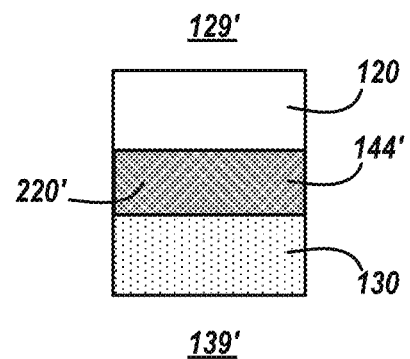

FIG. 12C and FIG. 12D depicts residual poison 220' within poisoned region 144' of TIM 140 that connects IC device 130 and lid 120, according to exemplary embodiments. As depicted in FIG. 12C, depending upon the type of poison 220, residual poison 220' may reside upon the applied surface 121 of lid 120 and/or surface 131 of IC device 130, subsequent to the curing of TIM 140' that forms TIM 140. As depicted in FIG. 12D, depending upon the type of poison 220, residual poison 220' may be dispersed within region 144', subsequent to the curing of TIM 140' that forms TIM 140.

Figure 13A:
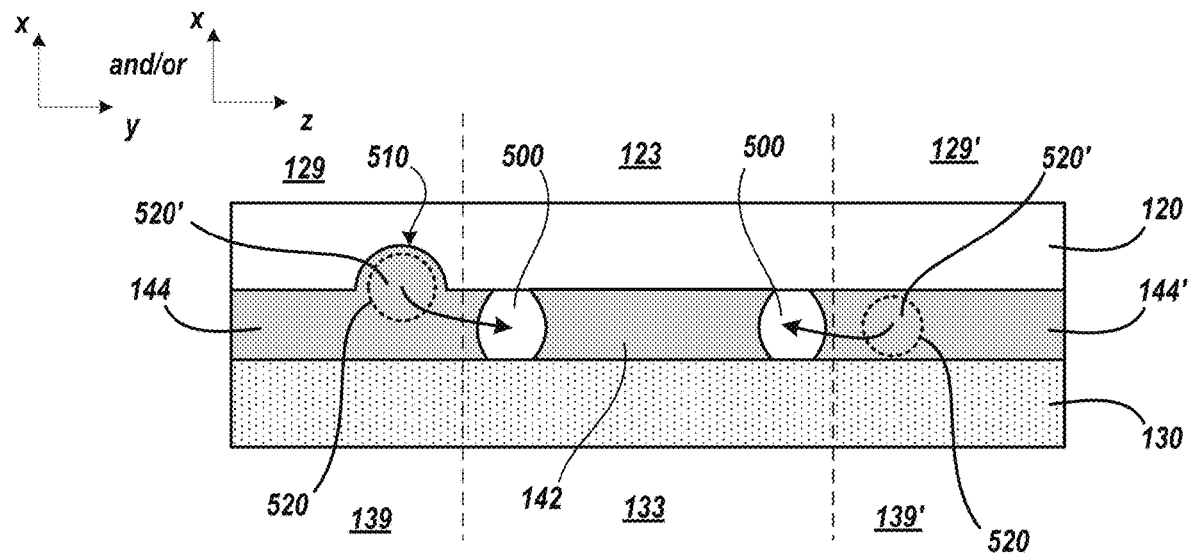
FIG. 13A depicts a thermal interface material that connects an IC device and an IC device package lid, according to exemplary embodiments.

FIG. 13A depicts TIM 140 that connects IC device 130 and IC device package lid 120, according to exemplary embodiments. During typical operation, IC device 130 is subjected to numerous thermal cycles in which the temperature of the IC device 130 increases and subsequently cools. Due to coefficient of thermal expansion (CTE) mismatches between the components of package 100, these thermal cycles may cause physical movement of TIM 140 material resulting in a TIM void 500 to form within TIM 140. TIM void 500 is an absence of TIM 140 that is caused by physical movement of TIM 140 material that results from the effects of CTE mismatch of components of package 100 and repeated thermal cycling of the IC device 130.

The TIM void 500 may grow with each thermal cycle and become so severe that a portion of the upper surface 131 of IC device 130 and/or a portion of underside 121 of lid 120 may be uncovered by or become disassociated with TIM 140. The TIM void 500 may become large enough that, as depicted, a portion of the upper surface 131 becomes disconnected from or is not connected to a portion of the underside 121 of lid 120 by any TIM 140.

In some instances, it has been determined that TIM voids 500 may have a higher propensity of forming within regions 142 of TIM 140. In other words, TIM voids 500 have a higher propensity of forming within TIM regions 142 that connect high powered or hot regions 133 of IC device 130 to lid 120.

Therefore, in some embodiments of the invention, weakly linked TIM 140 material 520' in region 144 within reservoir 520, which may be referred to as material 520', or super weakly linked TIM 140 in region 144' within reservoir 520, which may also be referred to as material 520', migrates from within region 144/144', respectively, into region 142 to fill, replace, displace, etc. the TIM void 500.

The reservoir 520 may be a section or portion of the TIM 140 within region 144/144' that neighbors or is directly adjacent to the region 142 that contains the void 500. The reservoir 520 may be located within a receptacle 510 within the lid 120 that is open to the underside 121. Therefore, in some embodiments in response to the formation of TIM void(s) 500, portions of weakly linked TIM in region 144 and/or portions of super weakly linked TIM in region 144' migrate or otherwise move from a region of TIM 140 that connects a relatively lower power or lower temperature sections 129/139 or 129'/139', respectively, to a region of TIM 140 that connects a relatively higher power or higher temperature section 123/133.

The migration of TIM 140 material 520' is generally enabled due to the formation of voids 500 in a region 142 neighboring or directly adjacent to the reservoir 520, due to the lower modulus of the weakly linked material TIM 140 material 520' within the reservoir 520 in regions 144/144', and due to the TIM 140 material being more weakly adhered to regions 129/139 or 129'/139', respectively.

Figure 13B:
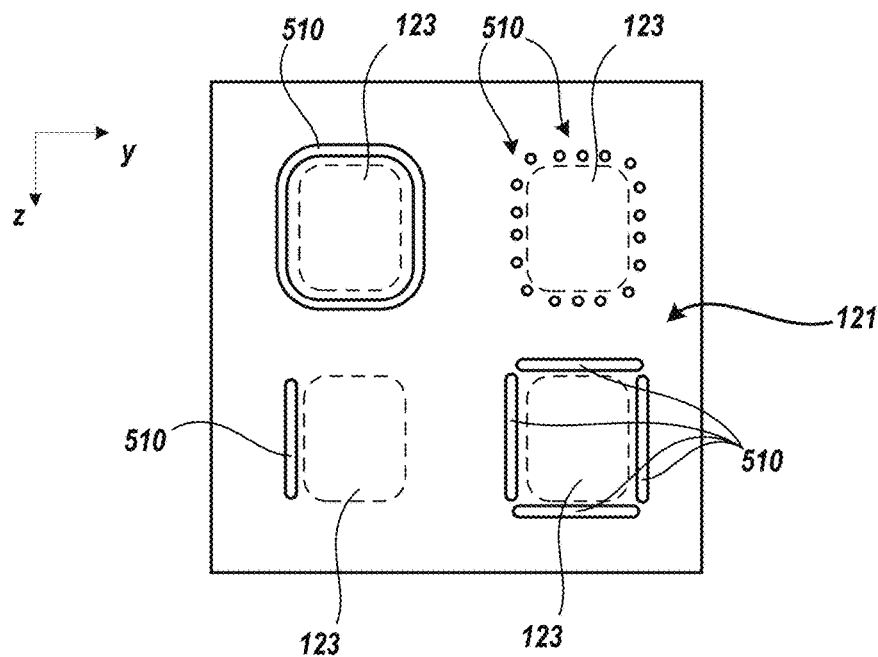
FIG. 13B depicts a normal view of an underside of an IC device package lid that includes one or more IC device region projections, according to exemplary embodiments.

FIG. 13B depicts a normal view of underside 121 of IC device package lid 120 that includes one or more IC device hot region projections 123, according to exemplary embodiments. The receptacle 510 is generally a cutaway of lid 120 that is open to underside 121 of lid 120. The receptacle 510 may neighbor or be located directly adjacent to hot region 123 so as to form the reservoir 520 of TIM 140 material that may migrate from regions 144/144' into region 142 of TIM 140. There are various shapes of receptacle 510 shown located about the perimeter of hot region projections 123. For example, receptacle 510 may be a continuous channel within the lid 120 open the underside 121 located around the perimeter of hot region projection 123, receptacle 510 may be a series of one or more holes within the lid 120 open the underside 121 located around the perimeter of hot region projection 123, receptacle 510 may be a broken or non-contagious channel within the lid 120 open the underside 121 located around the perimeter of hot region projection 123, receptacle 510 may be a channel within the lid 120 open the underside 121 located directly adjacent or neighboring one or more sides of hot region projections.

Figure 13C:
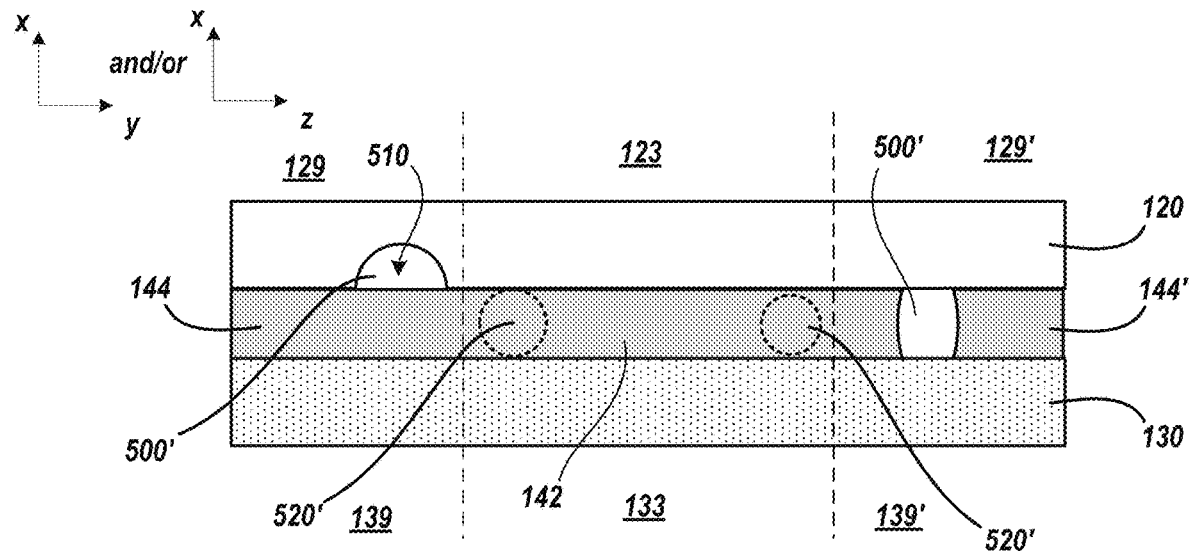
FIG. 13C depicts a thermal interface material that connects an IC device and an IC device package lid, according to exemplary embodiments.

FIG. 13C depicts TIM 140 that connects IC device 130 and IC device package lid 120, according to exemplary embodiments. After migration of TIM 140 material 520' within reservoir 520, such material 520' may at least partially fill, replace, displace, etc. the TIM void 500 within region 142. Because TIM 140 material 520' migrates from regions 144/144' to region 142, a new void 500' may be formed in regions 144/144'. That is, TIM 140 material may migrate from regions 144/144' into region 142 to promote TIM material presence and consistency through the thickness of the TIM 140 in region 142 that connects hot regions 123/133.

Figure 14:
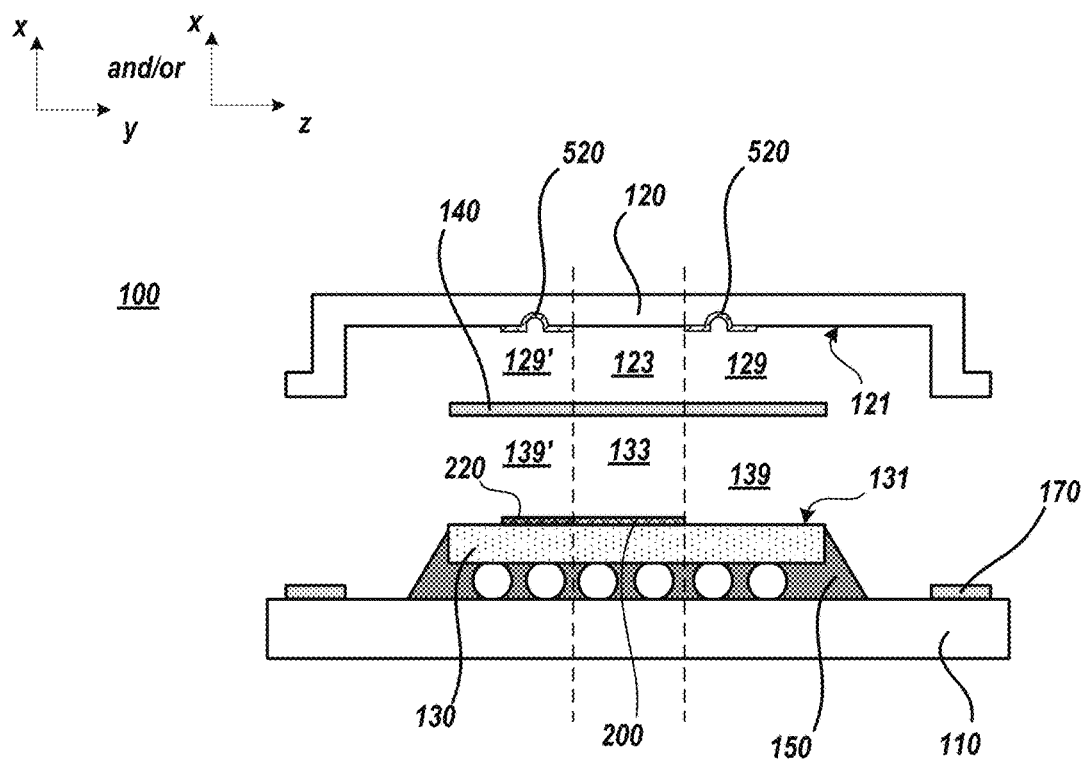
FIG. 14 depicts an IC device package fabrication stage, according to exemplary embodiments.

FIG. 14 depicts IC device package 100 fabrication stage 600, according to exemplary embodiments. At fabrication stage 300, a thermal interface phobic material (TIPM) 530 is formed upon surface 131 of IC device 300 and/or TIPM 530 is formed upon surface 121 of lid 120. In some instances, fabrication stage 300 and fabrication stage 600 may be integrated into the same fabrication stage.

At stage 600, the IC device 130 may be previously connected to the substrate 110 and the underfill 150 is in place. Further, at stage 300, seal band 170 may be previously applied to substrate 110. In this illustrative embodiment, TIPM 530 is selectively formed within region 129' upon surface 121 of lid 120, catalyst 200 is selectively formed within regions 133 upon surface 131 of IC device 300, and poison 220 is selectively formed within regions 139' upon surface 131 of IC device 300. TIPM 530 may further be formed upon the surface(s) of receptacle 510 that are open to surface 121 of lid 120, as depicted.

TIPM 530 is a substance that repels TIM 140 or repels components of TIM 140 and limits or reduces adhesion of TIM 140 thereto. TIPM 530 may also poison crosslinking of polymer chains of TIM 140 during curing thereof similar to poison 220. Exemplary TIPM 530 substances may be aromatics such as Benzene ($C_6H_6$) and Xylene ($C_8H_{10}$), Nitrogen (N) containing heterocyclic compounds, such as Pyridine ($C_5H_5N$), lipids with and without halogens such as Chloride, or the like.

TIPM 530 may be formed by known deposition techniques where e.g., a mask is applied to the surface in which TIPM 530 formed followed by spraying TIPM 530, drying TIPM 530, and removal of the mask; stamping techniques where e.g., a stencil is placed into a basin of TIPM 530 and stamped onto the surface in which TIPM 530 is applied; pad transfer techniques where e.g., a TIPM 530 is applied to a carrier film which is applied to the surface in which TIPM 530 formed and subsequent removal of the carrier film, or the like.

TIPM 530 may be formed as a layer upon the surface IC device 130 surface 131 and/or upon the underside 121 of lid 120, within regions 129'/139', to a thickness between 2 angstroms to 1 nm in thickness. In some embodiments, the surface within regions 129'/139' may be entirely coated or covered by TIPM 530, may have a 50 to 500 ppm surface coverage by TIPM 530, or the like.

In a preferred embodiment, a Xylene layer TIPM 530 is selectively formed within regions 129' upon surface 121 of lid 120 utilizing known deposition techniques. In this implementation, the Xylene layer TIPM 530 may be formed to a thickness ranging from 0.1 nm to 1 nm, with a preferred thickness of 0.5 nm.

Further, in this illustrative embodiment, within regions 132, 139 of IC device 130, the surface 131 of IC device 131 may be left exposed (i.e. TIPM 530 is not formed thereon) and within regions 123, 129 of lid 120, the surface 121 of lid 120 may be left exposed (i.e TIPM 530 is not formed thereon).

Figure 15:
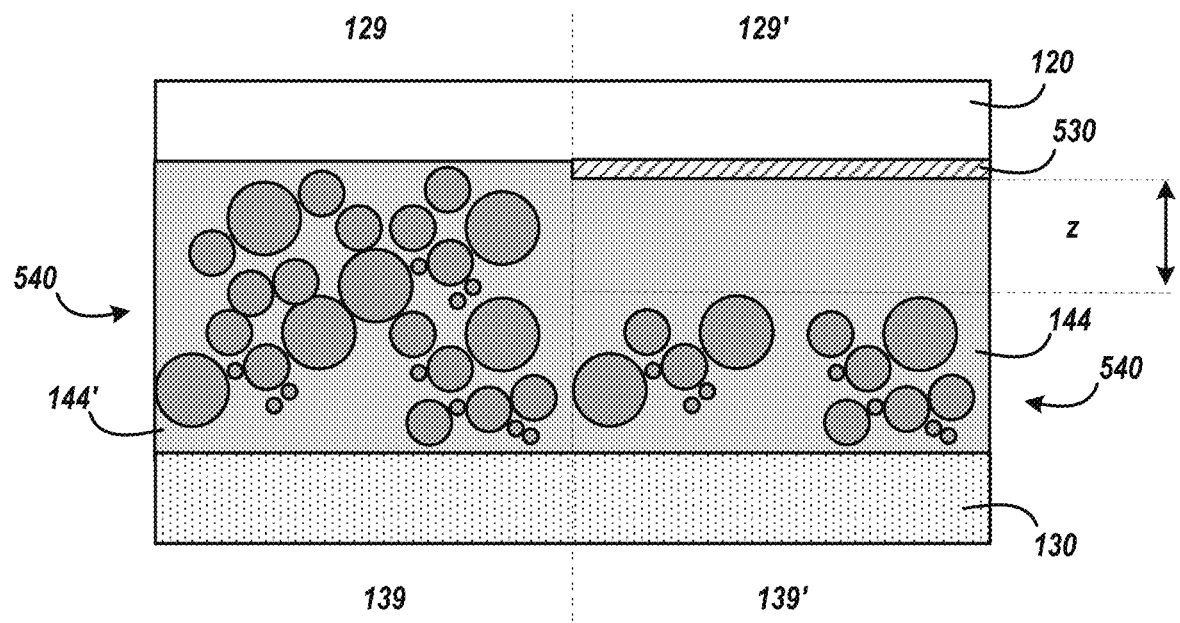
FIG. 15 depicts a thermal interface material that connects an IC device and an IC device package lid, according to exemplary embodiments.

FIG. 15 depicts TIM 140 that connects IC device 130 and IC device package lid 120, according to exemplary embodiments. As depicted, TIPM 530 may repel filler 540, which may also be referred herein as filler material, within TIM 140 by a dimension "z". Generally, due to the presence of TIPM 530, filler 540 within TIM 140 is displaced from lid 120 or from IC device 130 by an average dimension (e.g. dimension z) that is greater than the average dimension of filler 540 of TIM 140 within region 144' or within region 142 where TIPM 530 is not present.

In repelling the filler 540 within TIM 140, the TIM 140 heat transfer through the TIM 140 is reduced or otherwise limited and/or the relative adhesion of the TIM 140 to the lid 120 is reduced. In those regions where TIPM 530 is not present, the filler 540 within TIM 140 may be dispersed evenly or consistently through the thickness of TIM 140. As such, in these regions, heat transfer through the TIM 140 is relatively higher and/or the adhesion of the TIM 140 to the lid 120 is increased. As such, due to at least the decrease in adhesion to lid 120 and/or IC device 130, the TIM 140 in region 144', due to TIPM 530, is increasingly mobile relative to those regions where TIPM 530 is not present. Such mobility may create reservoir 520 of TIM material 520' within region 144' of TIM 140 that may migrate into region 142 and at least partially fill voids 500 formed therein.

In some instances, TIPM 530 may also poison crosslinking of polymer chains of TIM 140 during curing thereof, similar to poison 220. In these embodiments, the TIM 140 in region 144' is further mobile due to the weakly cross-linked TIM 140 therein. Such mobility may further create reservoir 520 of TIM material 520' within region 144' of TIM 140 that may migrate into region 142 and at least partially fill voids 500 formed therein.

Figure 16A:
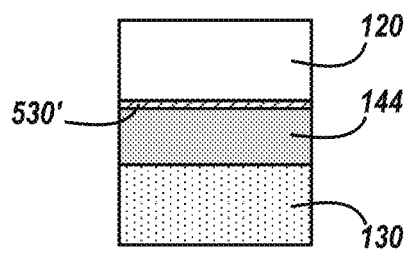
FIG. 16A and FIG. 16B depicts residual TIM filler phobic material within a poisoned region of a thermal interface material that connects an IC device and an IC device package lid, according to exemplary embodiments.
Figure 16B:
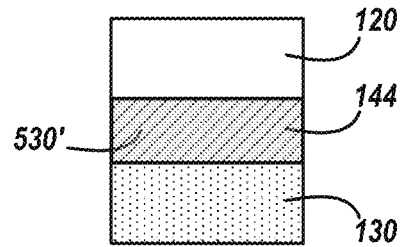

FIG. 16A and FIG. 16B depicts residual TIPM 530' within a poisoned region 144' of a TIM 140 that connects IC device 130 and IC device package lid 120, according to exemplary embodiments. As depicted in FIG. 16A, depending upon the type of TIPM 530, residual TIPM 530' may reside upon the applied surface 121 of lid 120 and/or surface 131 of IC device 130, subsequent to the curing of TIM 140' that forms TIM 140. As depicted in FIG. 16B, depending upon the type of TIPM 530, residual TIPM 530' may be dispersed within region 144', subsequent to the curing of TIM 140' that forms TIM 140.

Figure 17:
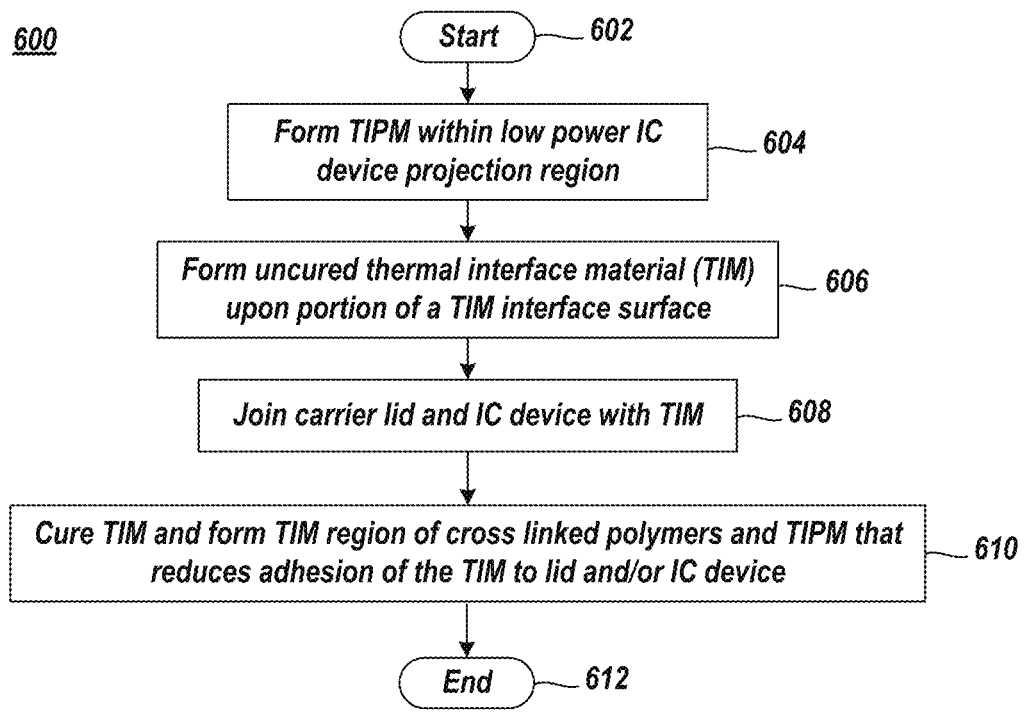
FIG. 17 depicts an IC device package fabrication method, according to exemplary embodiments.

FIG. 17 depicts an IC device package fabrication method 600, according to exemplary embodiments. Method 600 begins at block 602 and continues with forming TIPM 530 within a low power IC device projection region (block 604). For example, TIPM 530 may be selectively formed within regions 139' upon surface 131 of IC device 300 and/or TIPM 530 may be selectively formed within regions 129' upon surface 121 of lid 120.

Method 600 may continue with forming uncured TIM 140' upon one or more TIM interface surfaces (block 606). For example, uncured TIM 140' may be formed upon surface 131 of IC device 300 and/or uncured TIM 140' may be formed upon surface 121 of lid 120. Uncured TIM 140' may be dispensed upon surface 131 of IC device 300 and/or upon surface 121 of lid 120 by dispensing the uncured TIM 140' in a predetermined pattern, such as a star pattern, x pattern, or the like. Uncured TIM 140' may further be formed upon at least a portion of catalyst 200. For example, the pattern of dispensed uncured TIM 140' may traverse or intersect locations of catalyst 200 and may therefore also formed upon at least a portion of catalyst 200.

Method 600 may continue with joining lid 120 and IC device 130 with the uncured TIM 140' (block 608). In some instances, the lid 120 may also be connected to the substrate 110. For example, seal band 170 may be applied around the perimeter of the IC device 130 to correspond with substrate facing surface 123 of lid 120. The lid 120 may be joined to the seal band 170. In this manner, the lid 120 may be connected to substrate 110 by the seal band 170. Simultaneously, the lid underside surface 121 may be joined to the IC device 130. When thereto joined, the relative forces between the lid 120 and IC device 130 compresses the pattern of uncured TIM 140' so that uncured TIM 140' is formed upon the entire or substantially the entire surface 131 of IC device 130.

Method 600 may continue with curing the TIM 140' to form cured TIM 140 that includes a poisoned region 144' (block 610) that includes the polymer of TIM 140 and the TIPM that reduces adhesion of the TIM 140 to the lid 120 and/or to the IC device 130. The poisoned region 144' may have a lower coefficient of heat transfer relative to the second non catalytically enhanced cured region 144 due to the displacement of filler 540 within region 144' relative to the displacement of filler 540 within region 144. Method 400 may end at block 412.

As indicated herein, region(s) 142 may be located entirely, wholly, partially, etc. in association with respective high power regions 133 of the IC device 130 for more efficient heat transfer. In other implementations, region(s) 142 may be located to corresponded with a circumferential periphery region 650 (e.g., shown in FIG. 3) of the IC device 130 that extends from the sidewall(s) to an internal boundary around the circumference of IC device 130. For example, region 142 is applied to IC device 130 and/or to lid 120 to solely be located between region 650 of IC device 130 and lid 120. The enhanced cross-link density of such regions 142 may increase TIM cohesive and adhesive strength in association with the circumferential periphery region 650 of the IC device 130 and may mitigate any TIM 140 break or failure due to TIM strain which may or may not be cause by IC device 130 power on/off and/or temperature cycling.

The exemplary methods and techniques described herein may be used in the fabrication of IC chip packages. In such embodiments, the IC chip is mounted in a single chip package or in a multichip package. The IC chip is then integrated with other chips, discrete circuit elements and/or other signal processing devices as part of either (a) an intermediate product, such as a motherboard, or (b) an end product. The end product can be any product that includes IC chips, ranging from toys and other low-end applications to advanced computer products having numerous components, such as a display, a keyboard or other input device and/or a central processor, as non-limiting examples.

References herein to terms such as "vertical", "horizontal", etc. are made by way of example, and not by way of limitation, to establish a frame of reference. The term "horizontal" as used herein is defined as a plane parallel to the conventional plane or surface of the substrate 110, regardless of the actual spatial orientation of the IC device. The term "vertical" refers to a direction perpendicular to the horizontal, as just defined. Terms, such as "on", "above", "below", "side" (as in "sidewall"), "higher", "lower", "over", "beneath" and "under", are defined with respect to the horizontal plane. It is understood that various other frames of reference may be employed for describing the present invention without departing from the spirit and scope of the present invention.

The invention claimed is:
1. An integrated circuit (IC) device package comprising:
an IC device mounted upon a substrate;
a lid comprising a under surface that is connected to an upper surface of the IC device by a polymeric thermal interface material (TIM), the TIM comprising:
a first catalytically enhanced region comprising a first extent of polymer chain cross-linking comprising a first cross-link density enhanced by a catalyst localized upon a first portion of the upper surface of the IC device or upon a first portion of the under surface of the lid; and
a second non-catalytically enhanced region comprising a second extent of polymer chain cross-linking comprising a second cross-link density that is less than the first cross-link density.

2. The IC device package of claim 1, wherein the first catalytically enhanced region is above a hotspot region of the IC device.

3. The IC device package of claim 1, wherein the hotspot region is a projection of a core of the IC device onto the upper surface of the IC device.

4. The IC device package of claim 1, wherein the hotspot region is a projection of a processing region of a core of the IC device onto the upper surface of the IC device.

5. The IC device package of claim 1, wherein the first catalytically enhanced region has a higher coefficient of heat transfer than the second non-catalytically enhanced region.

6. The IC device package of claim 1, further comprising
a third poisoned region comprising a third extent of polymer chain cross-linking comprising a third cross-link density poisoned by a poison localized upon a second portion of the upper surface of the IC device or upon a second portion of the under surface of the lid, wherein the third cross-link density is less than the second cross-link density.

7. The IC device package of claim 1, wherein the first catalytically enhanced region is above a circumferential periphery region of the IC device.

8. A method of fabricating an integrated circuit (IC) device, the method comprising:
connecting an IC device upon a substrate;
forming a catalyst material upon a first portion of an upper surface of the IC device or upon a first portion of an undersurface of a lid;
connecting the undersurface of the lid to the upper surface of the IC device with a polymeric thermal interface material (TIM); and
curing the TIM to form:
a first catalytically enhanced region comprising a first extent of polymer chain cross-linking comprising a first cross-link density enhanced by the catalyst material; and
a second non-catalytically enhanced region comprising a second extent of polymer chain cross-linking comprising a second cross-link density smaller than the first cross-link density.

9. The method of claim 8, wherein the catalyst material is formed solely within a hotspot region of the IC device.

10. The method of claim 9, wherein the hotspot region is a projection of a core of the IC device onto the surface in which the catalyst material is formed.

11. The method of claim 9, wherein the hotspot region is a projection of a processing region of a core of the IC device onto the surface in which the catalyst material is formed.

12. The method of claim 8, further comprising:
forming a poison material upon a second portion of the upper surface of the IC device or upon a second portion of the undersurface of the lid.

13. The method of claim 12, wherein curing the TIM further forms a third poisoned region comprising a third extent of polymer chain cross-linking comprising a third cross-link density poisoned by the poison material, the third cross-link density smaller than the second cross-link density.

14. The method of claim 13, wherein the first catalytically enhanced region is above a circumferential periphery region of the IC device.

15. A method comprising:
connecting an integrated circuit (IC) device and a lid with a polymeric thermal interface material (TIM), the TIM comprising:
a first catalytically enhanced region comprising a first extent of polymer chain cross-linking comprising a first cross-link density enhanced by a catalyst localized upon a first portion of an upper surface of the IC device or upon a first portion of an under surface of the lid; and
a second non-catalytically enhanced region comprising a second extent of polymer chain cross-linking comprising a second cross-link density that is less than the first cross-link density.

16. The method of claim 15, wherein the first catalytically enhanced region is connected to a hotspot region of the IC device.

17. The method of claim 16, wherein the hotspot region is a projection of a core of the IC device onto the upper surface of the IC device that is connected to the first catalytically enhanced region.

18. The method of claim 17, wherein the hotspot region is a projection of a processing region of a core of the IC device that is connected to the first catalytically enhanced region.

19. The method of claim 15, wherein the first catalytically enhanced region has a higher coefficient of heat transfer than the second non-catalytically enhanced region.

20. The method of claim 15, wherein the TIM further comprises:
a third poisoned region comprising a third extent of polymer chain cross-linking comprising a third cross-link density poisoned by a poison localized upon a second portion of the upper surface of the IC device or upon a second portion of the under surface of the lid, wherein the third cross-link density is less than the second cross-link density.

* * * * *